(12) United States Patent
Mehta

(10) Patent No.: US 7,992,271 B2
(45) Date of Patent: Aug. 9, 2011

(54) PROCESS OF MANUFACTURING A PIEZOELECTRIC ACTUATOR FOR TUNABLE ELECTRONIC COMPONENTS ON A CARRIER SUBSTRATE

(75) Inventor: Sarabjit Mehta, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/622,931

(22) Filed: Nov. 20, 2009

(65) Prior Publication Data

US 2010/0064493 A1    Mar. 18, 2010

Related U.S. Application Data

(62) Division of application No. 10/421,303, filed on Apr. 22, 2003, now Pat. No. 7,656,071.

(60) Provisional application No. 60/420,174, filed on Oct. 21, 2002.

(51) Int. Cl.
*H04R 17/10* (2006.01)
(52) U.S. Cl. ............... 29/25.35; 427/96.2; 427/98.4; 427/100
(58) Field of Classification Search ............ 29/25.35; 427/96.2, 97.7, 98.4, 100; 310/324, 328, 310/330–332
See application file for complete search history.

(56) References Cited

U.S. PATENT DOCUMENTS 3,325,743 A    6/1967 Blum ........................ 330/5

(Continued)

FOREIGN PATENT DOCUMENTS

JP    59-169184    * 9/1984

(Continued)

OTHER PUBLICATIONS

Barker, N.S., et al., "Distributed MEMS True-Time Delay Phase Shifters and Wide-Band Switches," IEEE Transactions on Microwave Theory and Techniques, vol. 46, No. 11, pp. 1881-1890, Nov. 1998.

(Continued)

*Primary Examiner* — A. Dexter Tugbang
(74) *Attorney, Agent, or Firm* — Ladas & Parry

(57) ABSTRACT

A processes for manufacturing actuating assembly for tuning a circuit by forming a carrier substrate containing a membrane, a conductive layer, and piezoelectric actuators are disclosed. The process includes the steps of: providing a substrate having a bottom protective layer on a bottom side and etched trenches on a top side; depositing a top protective layer on the top side of the substrate; depositing a first conductive layer on the top protective layer; patterning the first conductive layer; patterning the bottom protective layer to form an etch mask aligned with the patterned first conductive layer; forming a piezoelectric structure on the top side of the substrate; depositing a membrane layer along the top side of the substrate and above the piezoelectric structure; curing the membrane layer; depositing a second conductive layer on the cured membrane layer; depositing a protective photoresist layer on the second conductive layer; patterning and hardbaking the photoresist layer; removing a portion of the substrate from the bottom side of the substrate, forming an etched opening in the substrate; removing a portion of the top protective layer; removing a portion of the second conductive layer to form a patterned second conductive layer; and removing the patterned photoresist layer. Changes in shape of the resulting piezoelectric arrangement allow a deflection of the membrane and a corresponding controllable upward or downward movement of the conductive element.

18 Claims, 5 Drawing Sheets

U.S. PATENT DOCUMENTS

| | | | |
|---|---|---|---|
| 3,513,356 A | 5/1970 | Newell | 317/101 |
| 3,603,921 A | 9/1971 | Dreisbach | 367/155 |
| 3,646,413 A | 2/1972 | Oomen | 361/281 |
| 4,099,211 A | 7/1978 | Hathaway | 360/109 |
| 4,237,399 A | 12/1980 | Sakamoto | 310/317 |
| 4,468,644 A | 8/1984 | Teague et al. | 333/205 |
| 4,716,331 A | 12/1987 | Higgins, Jr. | 310/330 |
| 4,717,847 A | 1/1988 | Nolan | 326/65 |
| 4,916,349 A | 4/1990 | Kornrumpf | 310/332 |
| RE33,568 E | 4/1991 | Harnden, Jr. et al. | 310/332 |
| 5,013,396 A * | 5/1991 | Wise et al. | 29/25.35 X |
| RE33,691 E | 9/1991 | Harnden et al. | 310/332 |
| 5,089,740 A | 2/1992 | Ono | 310/328 |
| 5,093,600 A | 3/1992 | Kohl | 310/332 |
| 5,101,278 A | 3/1992 | Itsumi et al. | 358/227 |
| 5,406,233 A | 4/1995 | Shih et al. | 333/161 |
| 5,548,313 A | 8/1996 | Lee | 347/68 |
| 5,654,819 A | 8/1997 | Goossen et al. | 359/291 |
| 5,870,007 A | 2/1999 | Carr et al. | 333/262 |
| 5,877,123 A | 3/1999 | Das | 505/210 |
| 5,923,522 A | 7/1999 | Sajna | 361/288 |
| 5,990,766 A | 11/1999 | Zhang et al. | 333/205 |
| 5,994,821 A | 11/1999 | Imada et al. | 310/332 |
| 6,127,908 A | 10/2000 | Bolzer et al. | 333/246 |
| 6,212,056 B1 | 4/2001 | Gammel et al. | 361/277 |
| 6,215,644 B1 | 4/2001 | Dhuler | 361/380 |
| 6,377,438 B1 | 4/2002 | Deane et al. | 361/278 |
| 6,404,304 B1 | 6/2002 | Kwon et al. | 333/202 |
| 6,472,962 B1 | 10/2002 | Guo et al. | 333/262 |
| 6,479,920 B1 | 11/2002 | Lal et al. | 310/309 |
| 6,496,351 B2 | 12/2002 | Hill et al. | 361/278 |
| 6,504,118 B2 | 1/2003 | Hyman et al. | 200/181 |
| 6,509,809 B1 | 1/2003 | Lynch | 333/26 |
| 6,587,008 B2 | 7/2003 | Hatanaka et al. | 331/68 |
| 6,606,235 B2 | 8/2003 | Chua et al. | 361/278 |
| 6,662,029 B2 | 12/2003 | Eden et al. | 505/210 |
| 6,700,309 B2 | 3/2004 | Dausch et al. | 310/330 |
| 6,768,628 B2 | 7/2004 | Harris et al. | 361/277 |
| 6,790,698 B2 | 9/2004 | Miller et al. | 438/50 |
| 6,962,832 B2 | 11/2005 | Chou | 438/52 |
| 7,054,460 B2 | 5/2006 | Rombach et al. | 381/421 |
| 7,057,251 B2 | 6/2006 | Reid | 257/432 |
| 7,085,121 B2 | 8/2006 | Lynch et al. | 361/277 |
| 7,098,577 B2 | 8/2006 | Mehta | 310/332 |
| 7,161,791 B2 | 1/2007 | Lynch et al. | 361/283.3 |
| 7,215,064 B2 | 5/2007 | Mehta | 310/331 |
| 7,343,655 B2 | 3/2008 | Mehta | 29/25.35 |
| 2002/0050882 A1 | 5/2002 | Hyman et al. | 335/78 |
| 2002/0109436 A1 | 8/2002 | Peng et al. | 310/328 |
| 2003/0036215 A1 | 2/2003 | Reid | 438/52 |
| 2003/0119220 A1 | 6/2003 | Micak et al. | 438/52 |
| 2004/0075364 A1 | 4/2004 | Mehta | 310/324 |
| 2005/0269911 A1 | 12/2005 | Usuda | 310/332 |
| 2006/0227489 A1 | 10/2006 | Bunyan et al. | 361/160 |
| 2007/0108875 A1 | 5/2007 | Klee et al. | 370/349 |
| 2007/0188049 A1 | 8/2007 | Song et al. | 310/322 |

FOREIGN PATENT DOCUMENTS

| | | |
|---|---|---|
| JP | 04184985 A | 7/1992 |
| JP | 09148643 A | 6/1997 |
| JP | 2002-170470 | 6/2002 |
| WO | 89/07345 | 8/1989 |
| WO | 01/13457 A1 | 2/2001 |
| WO | 02/45181 A1 | 6/2002 |
| WO | 2005/078752 A1 | 8/2005 |

OTHER PUBLICATIONS

Dec, A., et al., "Micromachines Varactor with Wide Tuning Range," Electronic Letters, vol. 33, No. 11, pp. 922-924, May 22, 1997.

M. Durlam, et al., "Nonvolatile RAM based on Magnetic Tunnel Junction Elements," ISSCC 2000/ Session 7/ TD: Emerging Memory & Device Technologies/ Paper TA 7.3, 2000.

Hung, E.S., et al., "Extending the Travel Range of Analog-Tuned Electrostatic Actuators," Journal of Micro Electro Mechanical Systems, vol. 8, No. 4, pp. 497-505, Dec. 1999.

Kondo, S., et al., "Precise Control of Small Displacements of a Stacked Piezoelectric Actuator by Means of Layer-By-Layer Driving," Micro Electro Mechanical Systems, 14$^{th}$ IEEE International Conference, pp. 248-251, 2001.

Li, M., et al., "New Tunable Phase Shifters Using Perturbed Dielectric Image Lines," IEEE Transactions on Microwave Theory and Techniques, vol. 46, No. 9, pp. 1314-1317, Sep. 1998.

Naji, Peter K., et al., "A 256kb 3.0V 1T1MTJ Nonvolatile Magnetoresistive RAM," ISSCC 2001/ Session 7/ Technology Directions: Advanced Technologies/ 7.6, 2001.

Park, J.Y., et al., "Micromachined RF Mems Tunable Capacitors Using Piezoelectric Actuators," IEEE MTT-S Digest, pp. 2111-2114, 2001.

Percin, G., et al., "Micromachined 2-D Array Piezoelectrically Actuated Flextensional Transducers," 1997 IEEE Ultrasonics Symposium, pp. 959-962, 1997.

Scheuerlein, Roy, et al., "A 10ns Read and Write Non-Volatile Memory Array using a Magnetic Tunnel Junction and FET Switch in Each Cell," ISSCC2000/ Session 7/ TD: Emerging Memory & Device Technologies/ Paper TA 7.2, 2000.

Yamaguchi, M., et al., "Distributed Electrostatic Micro Actuator," Proc. IEEE Conf. on Micro Electro Mechanical Syst., Fort Lauderdale, Fl., pp. 18-23, Feb. 7-10, 1993.

Yun, T., "Analysis and Optimization of a Phase Shifter Controlled by a Piezoelectric Transducer," IEEE Transactions on Microwave Theory and Techniques, vol. 50, No. 1, pp. 105-111, Jan. 2002.

* cited by examiner

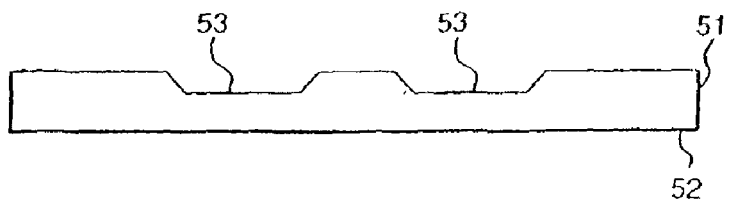
FIG. 7a
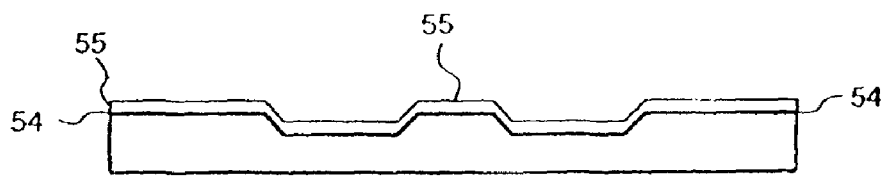
FIG. 7b
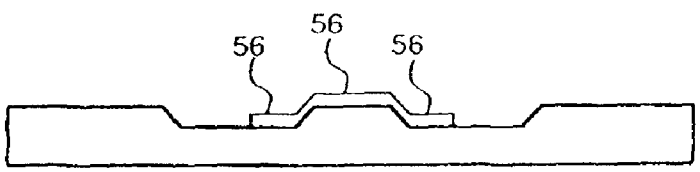
FIG. 7c
FIG. 7d
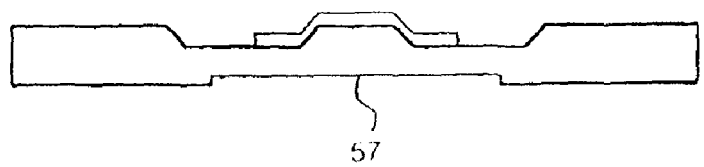
FIG. 7e
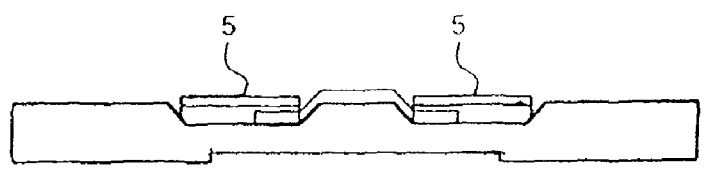
FIG. 7f
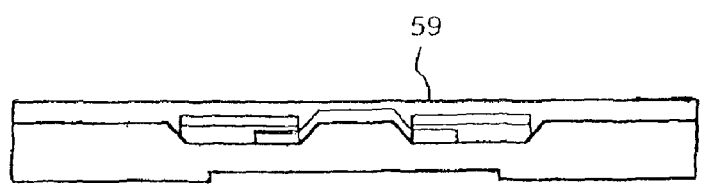

PROCESS OF MANUFACTURING A PIEZOELECTRIC ACTUATOR FOR TUNABLE ELECTRONIC COMPONENTS ON A CARRIER SUBSTRATE

CROSS-REFERENCE TO RELATED APPLICATIONS

This application is a division of U.S. patent application Ser. No. 10/421,303, filed on Apr. 22, 2003, now U.S. Pat. No. 7,656,071, which claims the benefit of U.S. Provisional Application No. 60/420,174 filed on Oct. 21, 2002, the disclosure of which is incorporated herein in its entirety. The present document is also related to the copending and commonly assigned patent application documents entitled "Variable Capacitance Membrane Actuator for Wide Band Tuning Microstrip Resonators and Filters," U.S. Ser. No. 10/421,302, and "Piezoelectric Switch for Tunable Electronic Components," U.S. Ser. No. 10/421,327, which are all filed on Apr. 22, 2003. The contents of these related applications are hereby incorporated by reference herein.

STATEMENT REGARDING FEDERALLY SPONSORED RESEARCH OR DEVELOPMENT

The present invention was made with support from the United States Government under Contract No. MDA972-00-C-0030 awarded by the DARPA TASS program. The U.S. Government has certain rights in the invention.

FIELD OF THE INVENTION

The present invention relates to actuators for tuning of resonators. More specifically, it relates to a piezoelectric actuator for tunable electronic components.

BACKGROUND OF THE INVENTION

It is desirable for microwave components like bandpass filters and resonators (microstrip, stripline or comb-line) to be tunable over a range of resonant frequencies. The techniques currently used for tuning utilize external elements like varactors or p-i-n diodes. These methods are inherently lossy and cannot maintain a high-Q, or quality factor, over the entire range of tunable frequencies. These limitations can be overcome by using membrane tuning, in which a metallized membrane is suspended over the tunable component, separated by an air gap. The tuning is achieved by changing the capacitive loading of the tunable component by moving the membrane closer or farther from it.

Several methods for membrane deflection have been utilized in the past.

A first type of prior art actuation devices use piezoelectric stacks for membrane deflection. A piezoelectric stack consists of 50-100 piezoelectric layers. In a piezoelectric stack, the thickness (T) of the layer is usually larger than the lateral dimensions, i.e. length (L) or width (W). The stack shortens or elongates along its thickness upon application of an actuation voltage. The piezoelectric stack needs to be several centimeters tall in order to achieve significant travel range for the membrane. This makes the structure bulky and difficult to integrate with the membrane and circuit. See, for example, "Precise control of small displacements of a stacked piezoelectric actuator by means of layer-by-layer driving" by Kondo, S; Yoshimura, S-I; Saito, N; Tanioka, K; Esashi, M. In Micro Electro Mechanical Systems, 2001. MEMS 2001, 14th IEEE International Conference, pp. 248-251.

A second type of actuation devices use electrostatic techniques for membrane deflection. The electrostatic technique involves deposition of thin metal electrodes on the membrane (top electrode) and substrate (bottom electrode), thereby offering the possibility of miniaturization. However, the technique has a severe limitation on the travel range of the membrane due to a nonlinear increase in the deflection force as the gap becomes small. As a result, the membrane collapses onto the substrate when the separation is about ⅓ of the original gap, preventing accurate control of the membrane position. This severely limits the tuning range of the component, which is strongly dependent on the membrane position as the separation becomes small. See, for example, M. Yamaguchi, S. Kawamura, K. Minami, and M. Esashi, "Distributed Electrostatic Micro Actuator," in Proc. IEEE Conf. on Micro Electro Mechanical Syst., Fort Lauderdale, Fla., Feb. 7-10, 1993, pp 18-23.

In order to decrease the nonlinear effect and partly resolve this problem, the top and bottom electrode positions can be laterally offset. However, this requires a significantly higher actuation voltage and still does not offer a precise control of the membrane position. Additionally, other aspects of the circuit design may place stringent constrains on the position of the electrodes, which would make this technique unfeasible. See, for example, Elmer S. Hung and Stephen D. Senturia, "Extending the Travel Range of Analog-Tuned Electrostatic Actuators", in J. Microelectromechanical Syst., vol. 8, no. 4, 1999, pp 497-505.

U.S. Pat. No. 5,994,821 to Imada et al. discloses the use of bimorph cantilevers to achieve flexural vibrations which can be used for light deflection. However, the cantilevers in Imada are primarily one-dimensional structures that require the bonding of two prefabricated piezoelectric layers. Additionally, the process disclosed in Imada is not compatible with wafer level photolithographic techniques. A further disadvantage is that the cantilevers in Imada cannot be designed for use as actuators to produce static membrane deflections, as the force generated is quite small.

The paper "Micromachined 2-D Array Piezoelectrically Actuated Flextensional Transducers" by Gokhan Percin and Butrus T. Khuri-Yakub, 1997 IEEE Ultrasonics Symposium, pp. 959-962, discloses piezoelectric actuators integrated with SiN, polysilicon or aluminum membranes. The structure described is used as an ultrasonic transducer, and gives extremely small static deflections (about 0.02 microns) when a 100 V actuation voltage is applied. This renders the actuator useless for tuning applications, for which much larger (about 20 microns) deflections are desirable. An enlargement of the structure to about 10 mm lateral dimensions does not work, as the membrane material is fragile at those sizes. In contrast, polymide membranes are extremely robust for thicknesses as small as about 4 microns and lateral dimensions of about 20 mm.

U.S. Pat. No. 5,406,233 describes a tunable stripline device using at least one strip conductor and at least one ground plane separated therefrom by a dielectric substrate. A layer of piezoelectric material is positioned adjacent the ground plane and a voltage applied to the piezoelectric layer causes its dimensions to change and provide a changing air gap between the substrate and the ground plane. A first disadvantage is that the movement caused by the piezoelectric layer is unidirectional only. A second disadvantage is that the changing air gap between the substrate and the ground plane is not uniform. A third disadvantage is that the device is not compatible with miniaturization and cleanroom processing techniques, so that custom lateral and vertical dimensions for the actuator cannot be fabricated.

SUMMARY OF THE INVENTION

The present invention circumvents the above problems by using a layered piezoelectric actuator. Such an actuator has a sizeable deflection for a small actuator size. Furthermore, the actuator can be fabricated using standard material growth and photolithographic techniques. The result is an integrated actuator of small dimensions that gives a relatively large membrane movement.

According to a first aspect, an actuating assembly for tuning a circuit is provided, the assembly comprising: a membrane having a top portion and a bottom portion, the membrane overlying the circuit to be tuned; a conductive element, connected with the bottom portion of the membrane, the conductive element overlying the circuit to be tuned; and a piezoelectric arrangement disposed on the top portion of the membrane, wherein changes in shape of the piezoelectric arrangement allow a movement of the membrane and a corresponding controllable upward or downward movement of the conductive element, and wherein, at any given time, a substantially uniform gap is formed between the conductive element and the circuit to be tuned.

According to a second aspect, a variable capacitance capacitor for tuning microwave components is provided, the capacitor comprising: a circuit to be tuned, forming a lower plate of the capacitor; a conductive element, forming an upper plate of the capacitor; a membrane connected with the conductive element; a piezoelectric arrangement connected with the membrane; and a voltage source connected with the piezoelectric arrangement, wherein changes in voltage from the voltage source change shape of the piezoelectric arrangement, thereby moving the membrane and the conductive element, thus varying the capacitance of the capacitor.

According to a third aspect, a method for tuning microwave components is provided, the method comprising the steps of: providing a microwave component to be tuned; providing a membrane having a top portion and a bottom portion; connecting a conductive element with the bottom portion of the membrane; disposing a first piezoelectric actuator over a first width peripheral region of the top portion of the membrane and a second piezoelectric actuator over a second width peripheral region of the top portion of the membrane, the first and second piezoelectric actuator comprising a respective first actuating layer and second actuating layer, the second actuating layer being located over the first actuating layer; and connecting the first and second actuating layer with a voltage source, wherein: when no voltage is applied from the voltage source, the first and second piezoelectric actuator do not cause the membrane to be deflected; when voltage having a first polarity is applied from the voltage source, the first and second piezoelectric actuator cause the membrane to be deflected in a first direction; and when voltage having a second polarity, opposite to the first polarity, is applied from the voltage source, the first and second piezoelectric actuator cause the membrane to be deflected in a second direction.

According to a fourth aspect, a process for combining a piezoelectric arrangement with a membrane is provided, the process comprising the steps of: (a) forming a trench into a first substrate; (b) depositing a metal circuit in the trench and patterning the metal circuit; (c) depositing a polymide layer onto the first substrate and the metal circuit; (d) providing a second substrate carrying a membrane and a conductive element; (e) connecting the second substrate with the first substrate; and (f) connecting the piezoelectric arrangement to the membrane.

According to a fifth aspect, a process for forming a carrier substrate containing a membrane, a conductive layer, and piezoelectric actuators is provided, the process comprising the steps of: (a) providing a substrate having a bottom protective layer on a bottom side and etched trenches on a top side; (b) depositing a top protective layer on the top side of the substrate; (c) depositing a first conductive layer on the top protective layer; (d) patterning the first conductive layer; (e) patterning the bottom protective layer to form an etch mask aligned with the patterned first conductive layer; (f) forming a piezoelectric structure on the top side of the substrate; (g) depositing a membrane layer along the top side of the substrate and above the piezoelectric structure; (h) curing the membrane layer; (i) depositing a second conductive layer on the cured membrane layer; (j) depositing a protective photoresist layer on the second conductive layer; (k) patterning and hard-baking the photoresist layer; (l) removing a portion of the substrate from the bottom side of the substrate, forming an etched opening in the substrate; (m) removing a portion of the top protective layer; (n) removing a portion of the second conductive layer to form a patterned second conductive layer; and (o) removing the patterned photoresist layer.

According to a sixth aspect, a process for combining a piezoelectric arrangement with a membrane is disclosed, comprising the steps of: (a) forming a trench into a first substrate; (b) depositing a metal circuit in the trench and patterning the metal circuit; (c) providing a second substrate carrying a membrane and a conductive element; (d) depositing a gold layer on at least one substrate between the first substrate and the second substrate; (e) connecting the second substrate with the first substrate; and (f) connecting the piezoelectric arrangement with the membrane.

A first advantage of the present invention is that the layered piezoelectric actuator can be integrated with a membrane structure. The integration process between the actuator and the membrane structure is compatible both with commercially available piezoelectric actuators and with thin film actuators that can be deposited at the time of fabrication.

A second advantage of the present invention is that the design of the actuator offers the flexibility of optimizing the membrane displacement and response time, which can be matched to the needs of the particular application.

A third advantage of the present invention is that applications that require cooling of the components to low temperatures (such as 77.degree. K) do not pose a problem, as any thermal mismatch is minimized, given that the actuator can be in the form of a thin film (e.g. 10 microns thick).

Additionally, the actuator wafer level fabrication process makes it possible to easily fabricate many hundreds or thousands of elements simultaneously. More particularly, the present invention is compatible with miniaturization and cleanroom processing techniques. This enables the fabrication of hundreds or thousands of membrane-actuator components on a single wafer, significantly lowering their cost. The final lateral dimensions can be sub-mm. The compatibility of the present invention with cleanroom processing techniques greatly facilitates the fabrication of custom lateral and vertical dimensions for the membrane and piezoelectric actuator. The actuator thickness can, therefore, be optimized to achieve a substantial vertical travel range (about .+−0.50 microns), while keeping the lateral dimensions relatively small (about 5-10 mm). This significantly enhances the tuning ability of the device. The prior art does not indicate the capability of any extensive travel range.

A further advantage of the present invention is that it significantly extends the tuning range for microwave components by allowing precise control of the membrane position at arbitrarily small separations from the substrate.

Additionally, the present invention is compatible with miniaturization of the various components, thereby significantly reducing the response time for the tuning process, as well as extending the applicability to higher frequency applications. More particularly, the piezoelectric layers can be optimally designed and supported on the membrane borders to prevent any mass loading. This gives a higher resonance frequency for the membrane-actuator assembly, thereby providing a short response time for the tuning process.

A still further advantage of the present invention is that it can actuate the membrane deflection in both directions, so that the membrane can be moved closed or farther from the underlying circuit. This is in contrast with the unidirectional motion of the prior art.

Additionally, the present invention is capable of moving a specific section of the membrane parallel to the substrate, thereby forming a well-defined and uniform gap between the membrane and the substrate. This in turn leads to a well defined capacitive coupling between the membrane and substrate, thereby providing a greater control of the tuning process. The prior art does not provide a uniform and parallel air gap.

BRIEF DESCRIPTION OF THE DRAWINGS

The features and advantages of the present invention will become better understood with regard to the following description, appended claims, and accompanying drawings where

FIGS. 6(a)-6(e) show a process according to the present invention for assembling a commercial piezoelectric actuator and a membrane; and FIGS. 7(a)-7(f) and 8(a)-8(f) show a process for assembling a thin film home-made piezoelectric actuator with a polymide membrane.

DETAILED DESCRIPTION OF THE INVENTION

Figure 1:
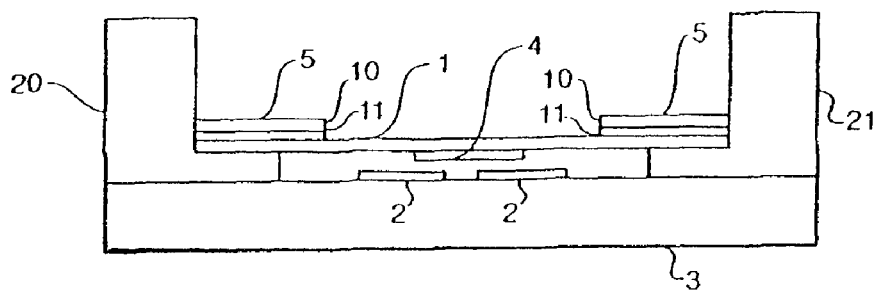
FIG. 1 shows a front sectional view of the membrane actuator according to a first embodiment of the present invention.

FIG. 1 shows a membrane 1, for example a polymide membrane, overlying a circuit 2 to be tuned. The circuit 2 is placed over a substrate 3. Lateral portions 20, 21 support the membrane 1. The membrane 1 carries a metal film 4, placed on the bottom portion of the membrane 1, that acts as the tuning element. Tuning of the circuit 2 is achieved via capacitive coupling between the metal film 4 and the circuit 2. In particular, a parallel plate capacitor is formed between the metal film 4 and the circuit 2. Since the capacitance for a parallel plate capacitor varies inversely with the size of the gap between the upper plate and the lower plate of the capacitor, the circuit 2 can be tuned by controlling the deflection of the membrane 1.

Deflection and control of the position of the membrane 1 is obtained through piezoelectric actuators 5 disposed on the top portion of the membrane 1. The actuators 5 allow the membrane 1, and correspondingly the metal film 4, to be moved either upwards or downwards. In the preferred embodiment, each actuator 5 comprises two layers 10, 11. The layers 10, 11 will bend upwards or downwards according to the sign of the voltage applied to the layers. A first embodiment of the invention provides that both layers are made of a piezoelectric material, i.e. that both layers are 'active' layers. A second embodiment of the invention provides that only one of the two layers is an active layer. In the second embodiment, the active layer can either be the top layer 10 or the bottom layer 11.

It is preferable to dispose the actuators so as to avoid mass loading of the membrane. Mass loading of the membrane 1 would slow down the response time of the tuning device. FIG. 1 shows a first way of disposing the actuators 5, namely along the width periphery of the membrane 1. Disposition of the actuators 5 along the periphery of the membrane 1 allows a portion of the actuators 5 to be supported by the horizontal component of the lateral portions 20, 21.

In particular, the layers 10, 11 of the actuators 5 are so positioned over the membrane 1 and the lateral portions 20, 21 that a first portion of each layer 10, 11 will lie both over the membrane 1 and the lateral portion 20 or 21, and a second portion of each layer 10, 11 will lie over the membrane 1 only. Upon application of a voltage, the first portion will provide the required support without mass loading the membrane, and the second portion will provide the upward/downward bending required for moving the membrane 1.

Additionally, upon application of a voltage, the shape of the membrane 1 will remain substantially parallel to the base of the substrate 3. In particular, the section of the membrane 1 placed above the tuning or conductive element 4 will undergo a movement parallel to the substrate, thereby forming a well-defined and substantially uniform gap between the membrane and the substrate, wherein the term 'uniform' is intended to mean that all regions of the conductive element 4 will be, at any time, substantially at the same distance from the circuit to be tuned. Deflection, force and response time of the tuning arrangement are a function of the dimension of the actuators 5. Therefore, deflection, force and response time of the arrangement can be optimized through patterning of the actuators 5.

According to the present invention, multi-layered structures having more than two actuation layers are also possible, but not preferred, given that their presence complicates the fabrication process without giving too much advantage in terms of membrane deflection.

Electrical connections to the actuators are not shown, for clarity purposes. FIG. 5, described later, will show one example of electrically connecting the actuators.

According to the preferred embodiment of the present invention, the layers 10 and 11 are each about 20 micrometers thick, the membrane 1 is about 10 micrometers thick and the distance between the membrane 1 and circuit 2 is about 50 micrometers.

Figure 2:
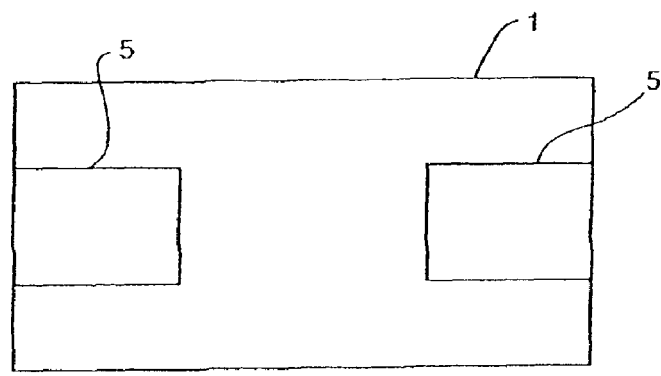
FIG. 2 shows a top plan view of the membrane and the actuator according to the first embodiment of the present invention.

FIG. 2 shows a top plan view of the membrane 1 and the actuators 5 with reference to the embodiment of FIG. 1, to better illustrate the preferred position of the actuators 5 with reference to the membrane 1. The membrane 1 can be about 10 mm long and about 6 mm wide, while the actuators can be about 4 mm long and about 3 mm wide.

Figure 3:
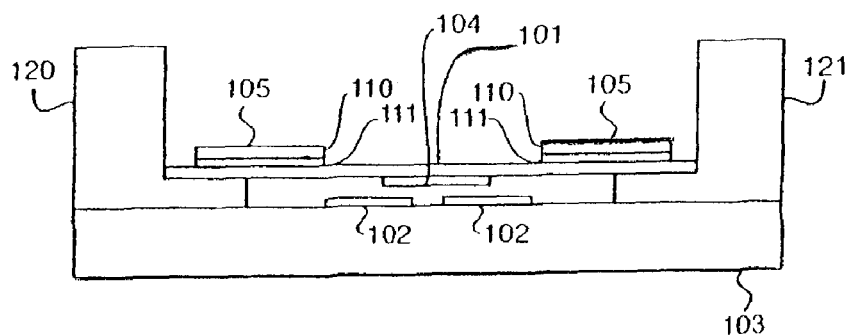
FIG. 3 shows a front sectional view of the membrane actuator according to a second embodiment of the present invention.
Figure 4:
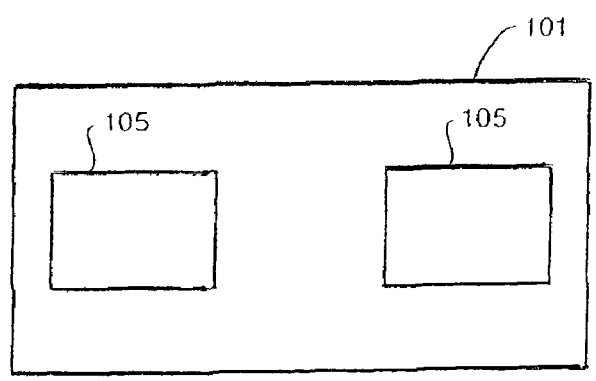
FIG. 4 shows a top plan view of the membrane and the actuator according to the second embodiment of the present invention.

FIGS. 3 and 4 correspond to FIGS. 1 and 2 and show an alternative embodiment of the actuators, wherein the actuators 105, although being positioned on a region of the membrane different from the periphery of the membrane, nevertheless allow preventing mass loading of the membrane 101. In particular, also in this embodiment, a first portion of each actuator lies both over the membrane 101 and the lateral portion of the substrate, and a second portion of each actuator lies over the membrane only.

FIGS. 2 and 4 show actuators 5, 105 having a substantially rectangular shape when viewed from the top. This shape, although preferred, has been shown for explanatory purposes only. Other shapes are also possible, so long as mass loading of the membrane is reduced or prevented.

Figure 5A:
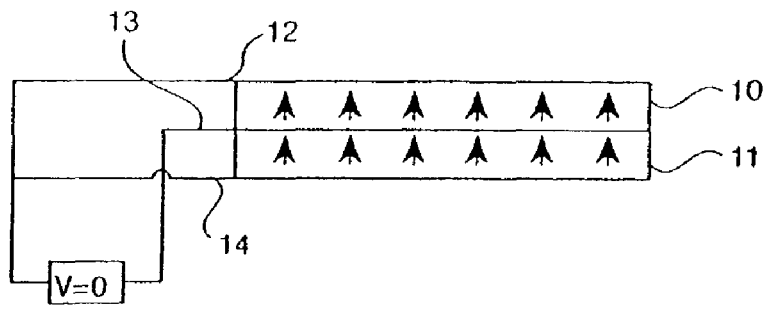
FIGS. 5(a)-5(c) show schematic views of a two-layered piezoelectric actuator with parallel polarization directions, to be used in accordance with the present invention.
Figure 5B:
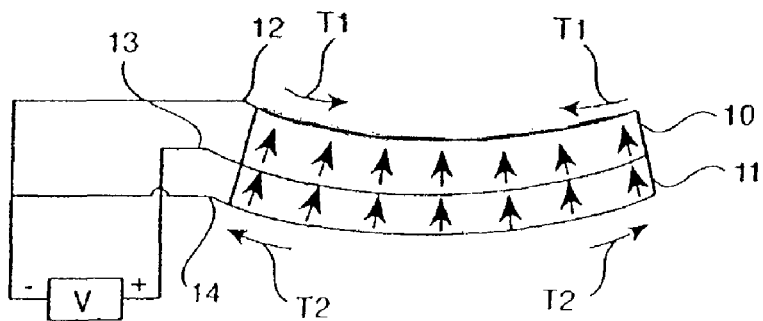
Figure 5C:
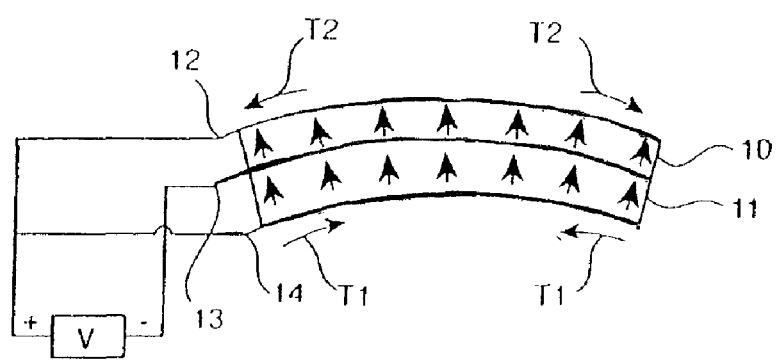

FIGS. 5(a) to 5(c) show schematic views of a two-layered piezoelectric actuator with parallel polarization directions to be used in accordance with the present invention. The polarization directions are shown by the small arrows depicted within each layer. The actuator shown in FIGS. 5(a)-5(c) comprises an upper layer 10 and a lower layer 11. Electrodes 12, 13, and 14 are alternated with layers 10 and 11. Layers 10 and 11 deflect on applying voltages between the electrodes 12, 13 and 14. On choosing the proper polarities for the voltage, a tensile force T1 or thrusting force T2 can be generated in the plane of the layers 10, 11. The forces T1, T2 will create a deflection in the middle section of the layers 10, 11. For a given piezoelectric material such as PZT or PLZT, the amount of deflection and force depends on the dimension of the layers, which can be adjusted to meet the requirements of the particular application.

When no voltage is applied, the actuator does not cause the membrane to be deflected, as shown in FIG. 5(a). When voltage having a first polarity is applied, for example a positive polarity, the actuator causes the membrane to be deflected in a first direction, for example upwards, as shown in FIG. 5(b). When voltage having a second polarity, opposite to the first polarity, is applied, for example a negative polarity, the actuator causes the membrane to be deflected in a second direction, for example downwards, as shown in FIG. 5(c).

The present invention also discloses a process for combining a piezoelectric actuator, like for example the actuator 5 shown in FIGS. 1-5, with a polymide membrane.

According to a first embodiment of the process, the actuator is purchased commercially and then combined with the membrane. Combination of the commercially available actuator (for example a PI Ceramic PL-122.251 actuator, about 0.5 mm thick) with the membrane can be obtained by means of a thin layer of adhesive, about 1 micron thick. The use of the thin layer of adhesive will be described in better detail with reference to FIG. 6(c)(1).

According to a second embodiment of the process, the actuator is made in-house and integrated with the membrane during the fabrication process. Note that the actuating assembly shown in FIGS. 1-4 may be fabricated by processes other than those depicted in the following figures. Further, while the following figures depict multiple separate fabrication steps, alternative fabrication processes may allow several separate steps to be combined into fewer steps. Finally, alternative fabrication processes may use a difference sequence of steps.

FIGS. 6(a)-6(e) show a process according to the first embodiment of the present invention, where a commercial piezoelectric actuator is assembled with a membrane. In each step of the process, generally known microfabrication techniques, such as masking, etching, deposition, and lift-off are used.

Figure 6A:
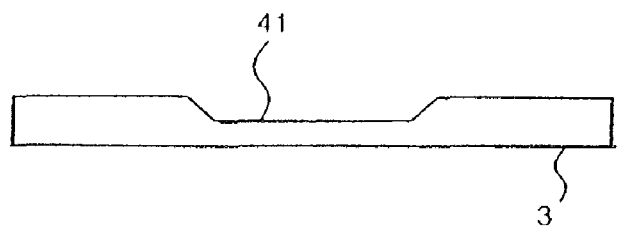

FIG. 6(a) shows a first step, where a trench 41 having a trench depth is patterned into the silicon wafer substrate 3. The trench depth is equal to the height of the air gap (for example between about 10 and about 100 microns) between the membrane (like the membrane 1 of FIG. 1) and the circuit to be tuned (like the circuit 2 of FIG. 1).

Figure 6B:
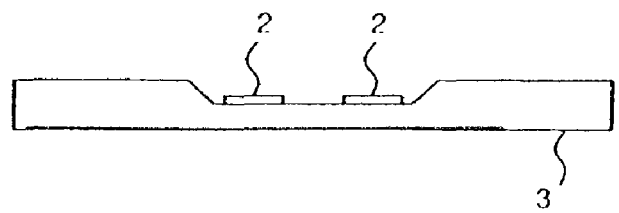

FIG. 6(b) shows a second step, where the metal circuit 2 is deposited and patterned in the trench.

FIG. 6(c)(1) shows a third step, where a thin layer 44, about 1 micron thick, of polymide, for example PIX-1400, is spinned onto the wafer 3 and the metal circuit 2. The polymide layer 44 will act as an adhesive to bond the base substrate (the substrate comprising the circuit), and the carrier substrate (the substrate carrying the membrane and the actuator), together.

FIG. 6(c)(2) shows a third step alternative to the third step shown in FIG. 6(c)(1), where a polymide layer 44 is spinned onto a separate test wafer (not shown in the figures) and then the layer is transferred onto the base substrate 3 by pressing the base substrate 3 onto the test wafer and then lifting or sliding it off. Alternatively to the polymide layer 44, a thin layer of gold, e.g. a layer having a thickness of 1.mu.m, can be deposited on the substrate 3.

If the step of FIG. 6(c)(1) is followed, the thin layer of adhesive over the circuit does not pose a problem regarding the device performance. In the following steps it will be assumed that the third step of FIG. 6(c)(2) has been followed.

Figure 6D:
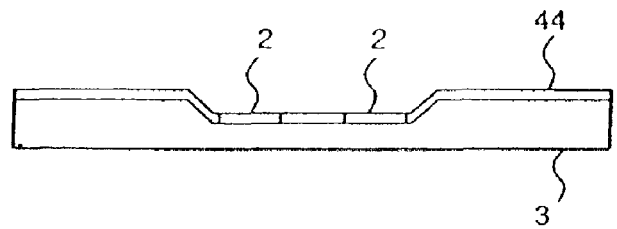
Figure 6D:
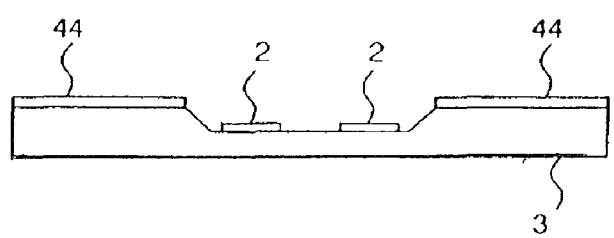
Figure 6D:
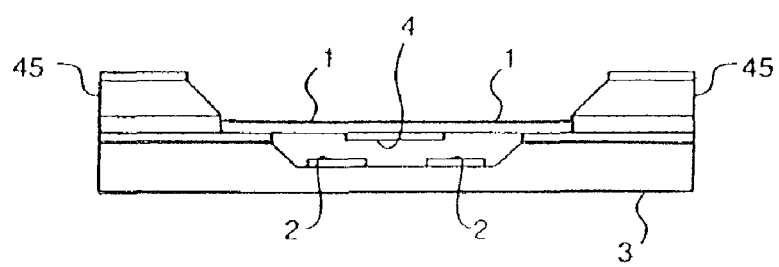

FIG. 6(d) shows a fourth step, where a carrier substrate 45 carrying the membrane 1 and the metal film 4 is aligned and pressed onto the base substrate 3. Bonding between the carrier substrate 45 and the base substrate 3 is obtained, for example, by pre-baking at about 100.degree. C. for about 120 seconds, followed by a hard bake at about 120.degree. C. for about 1 hour. In case a layer of gold is used, as disclosed above, such layer can be present either on the substrate 3, or on the substrate 45, or on both of them. Once gold is used, the bonding process preferably requires a first step of pressing the substrates 3 and 45 together and a second step of heating at a temperature preferably comprised between 200.degree. C. and 400.degree. C.

Figure 6E:
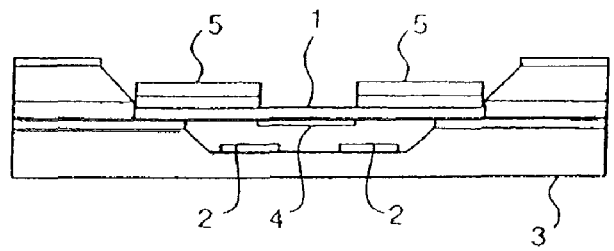

FIG. 6(e) shows a fifth step, where the two-layered actuators 5 are connected to the membrane 1.

The connection is obtained by spinning or transferring a thin layer of polymide on the commercial piezoelectric actuators 5. The actuators 5 are then aligned and gently pressed onto the border of the membrane 1, followed by hard baking at about 120.degree. C. for about 1 hour to strengthen the bond. The actuators 5 are thus anchored on the membrane. As already explained with reference to FIGS. 1-4, a first, inner, portion of the actuators 5 is supported by the membrane only, while a second, outer, portion of the actuators 5 is supported by the membrane and the substrate.

FIGS. 7(a)-7(f) and FIGS. 8(a)-8(f) show a process according to the second embodiment of the present invention, where a thin film home-made piezoelectric actuator is assembled with the polymide membrane during the fabrication process. The process according to the second embodiment is preferred, because a thin film piezoelectric actuator provides more flexibility in optimizing the thickness and lateral dimensions of the actuator as compared to a commercially available one. In each step of the process, generally known microfabrication, techniques such as masking, etching, deposition, and lift-off are used.

FIGS. 7(a)-7(f) show a first series of steps of the process according to the second embodiment.

FIG. 7(a) shows a first step, where a silicon wafer 51 having a protective layer 52 (for example a SiN layer) deposited on the bottom side and etched trenches 53 on the top side is provided. The layer 52 is, for example, 0.5 microns thick. The depth of the trenches 53 is substantially equal to the thickness of the thin film piezoelectric actuator later obtained.

FIG. 7(b) shows a second step, where a protective layer 54 (for example a SiN layer) of about 0.5 microns and a 0.5 microns Ti—Pt metal film 55 are deposited on the top side of the silicon wafer 51.

FIG. 7(c) shows a third step, where the Ti—Pt film 55 is patterned into rectangular pads 56.

FIG. 7(d) shows a fourth step, where the protective layer 52 on the bottom side of the wafer is patterned to form a mask 57 for the silicon etch. The window formed by means of the mask 57 is carefully aligned to the metal pads on the top side using an infrared mask aligner. Infrared aligners are known per se to the person skilled in the art, and will not be described in detail in the present application.

FIG. 7(e) shows a fifth step, where the two-layered piezoelectric actuating structure 5 is formed. The piezoelectric structure comprises, for example, two layers of piezoelectric film intertwined with three layers of metal electrodes. For example, in case both layers are active, i.e. made of a piezoelectric material, the bottom electrode can be made of Ti—Pt, the middle electrode can be made of Ti—Pt, and the top electrode can be made of any metal. The metal electrodes are not shown in FIG. 7(e), for clarity purposes. For a schematic representation of the metal electrodes, reference can be made, for example, to the elements 12 to 14 of FIGS. 5(a) to 5(c). The metal electrodes can have arms, not shown in FIG. 7(e) for clarity purposes, extending out of the trench to allow access to them.

FIG. 7(f) shows a sixth step, where a polymide layer 59 (forming the membrane 1 shown in FIG. 1) is spinned to achieve the desired thickness (usually about 4 to 30 microns). Additionally, the polymide layer 59 is cured at a temperature between about 200.degree. C. and 400.degree. C., preferably about 300.degree. C., to firmly embed the piezoelectric actuating structure in the polymide.

FIGS. 8(a)-8(f) show a second series of steps of the process according to the second embodiment.

Figure 8A:
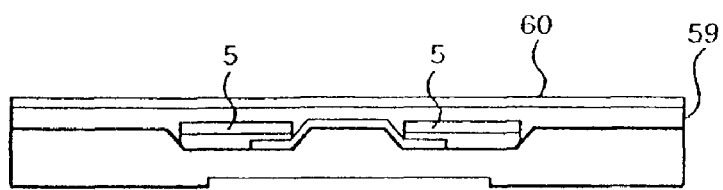

FIG. 8(a) shows a seventh step, following the sixth step of FIG. 7(f), where a metal film 60, for example a Ti—Au film, is deposited on the cured polymide 59. The metal film 60 will eventually be patterned into a tuning electrode like the metal film 4 of FIG. 1.

Figure 8B:
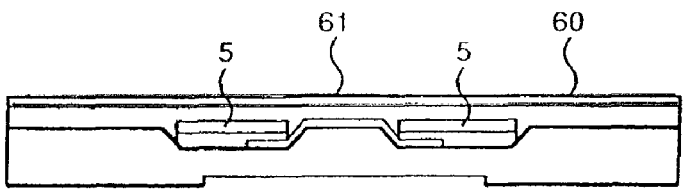

FIG. 8(b) shows an eighth step, where photoresist 61 is spinned, patterned and hard baked on the film 60 to act as a protective layer against the metal etchants used in the following tenth step.

Figure 8C:
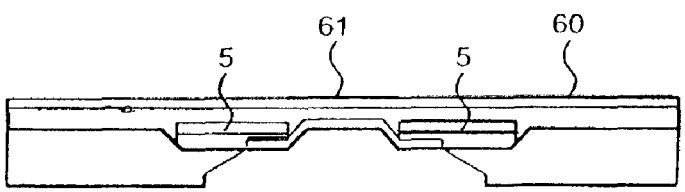

FIG. 8(c) shows a ninth step, where silicon is etched from the backside of the wafer by mounting the wafer in a customized wafer holder and immersing the holder in a KOH solution at about 100.degree. C. The wafer holder, not shown in the figure but well known per se to the person skilled in the art, seals the polymide side from the KOH solution.

In this way, an opening 62 etched in the silicon substrate is formed. Preferably, the lateral dimensions of the metal pads 56 are just smaller (about 100 microns) than the lateral dimensions of the opening 62. The lateral dimensions are the length and the width of the rectangular (when looking from the top) Ti—Pt film pad 56. The lateral dimensions of the pads 56 are preferably smaller than the lateral dimensions of the opening 62 to possibly enable removal of the Ti—Pt pad. The use of a Ti—Pt pad is preferred, to make the fabrication process for the polymide membranes on silicon wafers more reliable. Embodiments where the Ti—Pt pad is not removed are also possible. In such embodiments, the Ti—Pt pad will form one of the electrodes.

Figure 8D:
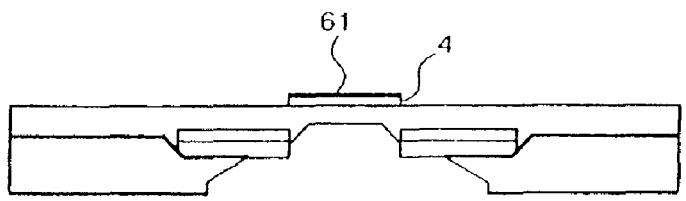

FIG. 8(d) shows a tenth step, where a portion of protective layer 54, a portion of the Ti—Au layer 60, and the rectangular pads 56, are etched away, for example by successively immersing the wafer in buffered oxide etchant (BOE) solution together with a metal etchant solution and by dry etching. As a consequence of this step, the metal film 4 of FIG. 1 is formed. Alternatively, the rectangular pads 56 can be kept, to be used as a portion of the bottom electrode.

Figure 8E:
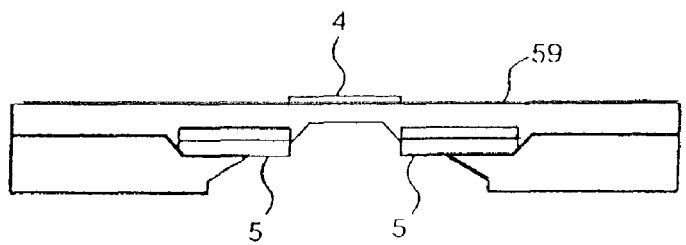

FIG. 8(e) shows an eleventh step, where the residual photoresist 61 is removed, for example by spraying with acetone and spin drying. In this way, a carrier substrate containing a polymide membrane 59, a metal film 4, and actuators 5 is obtained.

Figure 8F:
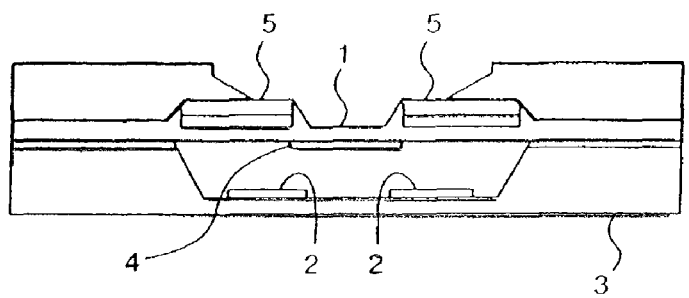

FIG. 8(f) shows a step where the carrier substrate obtained through the process described in FIGS. 7(a) to 8(e) is bonded to a base substrate like the one disclosed in FIG. 6(c)(2) to form the tunable device according to the present invention. As also disclosed in the embodiment fo FIG. 6d, gold can be used to bond the two substrates.

With reference to FIG. 6(e) and FIG. 8(f), they both show a two-layered global structure, where the first layer comprises a wafer with membrane and actuator, and the second layer comprises a wafer with a circuit pattern or component. Given that the structure only contains two layers, such structure can be miniaturized using standard cleanroom processing techniques.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

What is claimed is:

1. A process for forming a carrier substrate containing a membrane, a conductive layer, and piezoelectric actuators, comprising the steps of:
   providing a substrate having a bottom protective layer on a bottom side and etched trenches on a top side;
   depositing a top protective layer on the top side of the substrate;
   depositing a first conductive layer on the top protective layer;
   patterning the first conductive layer;
   patterning the bottom protective layer to form an etch mask aligned with the patterned first conductive layer;
   forming a piezoelectric structure on the top side of the substrate;
   depositing a membrane layer along the top side of the substrate and above the piezoelectric structure;
   curing the membrane layer;
   depositing a second conductive layer on the cured membrane layer;
   depositing a protective photoresist layer on the second conductive layer;
   patterning and hard-baking the photoresist layer;
   removing a portion of the substrate from the bottom side of the substrate, forming an etched opening in the substrate;
   removing a portion of the top protective layer;
   removing a portion of the second conductive layer to form a patterned second conductive layer; and
   removing the patterned photoresist layer.

2. The process of claim 1, further comprising a step of removing the patterned first conductive layer.

3. The process of claim 1, wherein the piezoelectric structure is a two-layered piezoelectric structure.

4. The process of claim 1, wherein the top protective layer is a SiN layer.

5. The process of claim 1, wherein the bottom protective layer is a SiN layer.

6. The process of claim 1 wherein, in the step of curing the membrane layer, the membrane layer is cured at about 300 degrees Celsius.

7. The process of claim 1, wherein the first conductive layer is a titanium (Ti) and platinum (Pt) metal film.

8. The process of claim 1, wherein in the step of patterning the first conductive layer, the first conductive layer is patterned into rectangular pads.

9. The process of claim 8, wherein the rectangular pads and the etched opening in the substrate have a lateral dimension, the lateral dimension of the rectangular pads being smaller than the lateral dimension of the etched opening in the substrate.

10. The process of claim 1, wherein the second conductive layer is a titanium (Ti) and platinum (Pt) film.

11. The process of claim 1, wherein the step of removing the portion of the substrate from the bottom side of the substrate, forming the etched opening in the substrate, is performed by immersing the substrate in a KOH solution at about 100 degrees Celsius.

12. The process of claim 1, wherein the steps of removing the portion of the top protective layer and removing the portion of the second conductive layer are performed by successively immersing the substrate in a buffered oxide etchant and metal etchant solution.

13. The process of claim 1, wherein the steps of removing the portion of the top protective layer and removing the portion of the second conductive layer are performed by successively immersing the substrate in a buffered oxide etchant solution and by dry etching.

14. The process of claim 1, wherein the step of removing the patterned photoresist layer is performed by spraying with acetone and spin drying.

15. The process of claim 1, wherein the membrane layer is a polymide membrane.

16. The process of claim 1, further comprising the step of bonding the carrier substrate containing the membrane, the conductive layer, and the piezoelectric actuators obtained after the step of removing the patterned photoresist layer to a substrate containing a trench and a metal circuit.

17. The process of claim 16, wherein the step of bonding the carrier substrate to a substrate containing the trench and the metal circuit comprises the step of providing a gold layer on at least one substrate between the carrier substrate and the substrate containing the trench and the metal circuit.

18. The process of claim 17, wherein the step of bonding the carrier substrate and the substrate containing the trench and the metal circuit further comprises the steps of pressing the carrier substrate on the substrate containing the trench and the metal circuit and heating the pressed substrates.

* * * * *